United States Patent
Pillin et al.

(10) Patent No.: US 9,360,504 B2
(45) Date of Patent: Jun. 7, 2016

(54) ENVELOPE DETECTOR CIRCUIT

(71) Applicant: EM Microelectronic-Marin SA, Marin (CH)

(72) Inventors: Nicolas Pillin, St-Sulpice (CH); Goran Stojanovic, Neuchatel (CH); Tony Ghueldre, Montignac (FR)

(73) Assignee: EM Microelectronic-Marin SA, Marin (CH)

( * ) Notice: Subject to any disclaimer, the term of this patent is extended or adjusted under 35 U.S.C. 154(b) by 0 days.

(21) Appl. No.: 14/535,032

(22) Filed: Nov. 6, 2014

(65) Prior Publication Data

US 2015/0136857 A1     May 21, 2015

(30) Foreign Application Priority Data

Nov. 18, 2013    (EP) ..................................... 13193326

(51) Int. Cl.
     *G06K 19/06*      (2006.01)
     *G01R 19/04*      (2006.01)
     *G06K 7/00*      (2006.01)
     (Continued)

(52) U.S. Cl.
     CPC .............. *G01R 19/04* (2013.01); *G06K 7/0008* (2013.01); *G06K 19/07* (2013.01); *G06K 19/0713* (2013.01); *H03D 1/10* (2013.01); *H03D 1/18* (2013.01); *H04L 27/06* (2013.01); *H03D 2200/0011* (2013.01); *H03D 2200/0043* (2013.01); *H03D 2200/0098* (2013.01)

(58) Field of Classification Search
     CPC . G01R 19/04; H03D 1/10; H03D 2200/0011; G06K 19/07771; H04L 27/0002; H04L 27/06; H04L 27/08
     See application file for complete search history.

(56) References Cited

U.S. PATENT DOCUMENTS

| | | | |
|---|---|---|---|
| 4,000,472 A | 12/1976 | Eastland et al. | |
| 6,265,940 B1 | 7/2001 | Adachi | |

(Continued)

FOREIGN PATENT DOCUMENTS

GB     1091318 A     11/1967

OTHER PUBLICATIONS

European Search Report issued in corresponding application EP 13 19 3326.9, completed May 7, 2014.

(Continued)

*Primary Examiner* — Thien M Le
*Assistant Examiner* — Asifa Habib
(74) *Attorney, Agent, or Firm* — Oblon, McClelland, Maier & Neustadt, L.L.P.

(57) ABSTRACT

An envelope detector circuit, suitable for use in RFID tags, includes a voltage doubler circuit and a biasing voltage generating circuit which comprises components matched respectively to rectifying components of the voltage doubler circuit. A rectifying component of this voltage doubler circuit is formed by a transistor controlled by the biasing voltage generating circuit which provides a biasing voltage to a control gate of this transistor, the biasing voltage generating circuit being arranged so as to permit a determined forward biasing current to flow through the transistor and further rectifying elements of the voltage doubler circuit. This embodiment provides fast, highly sensitive detection of envelope waveforms in input signals. Thanks to the matched rectifying components, efficiency variations due to variations in manufacturing process can be eliminated. The envelope detector circuit is further arranged for maintaining a stable detection independent of variations in temperature.

13 Claims, 1 Drawing Sheet

(51) Int. Cl.
*H03D 1/10* (2006.01)
*H03D 1/18* (2006.01)
*H04L 27/06* (2006.01)
*G06K 19/07* (2006.01)

(56) References Cited

U.S. PATENT DOCUMENTS 7,375,578 B1 * 5/2008 Blanchard et al. ............ 327/427

2011/0316673 A1 * 12/2011 Song et al. ................... 340/10.1

OTHER PUBLICATIONS

Yueh-Hua Yu et al., "An LTPS TFT Demodulator for RFID Tags Embeddable on Panel Displays", IEEE Transactions on Microwave Theory and Techniques, IEEE Service Center, Piscataway, NJ, vol. 57, No. 5, May 1, 2009, pp. 1356-1361.

* cited by examiner

ENVELOPE DETECTOR CIRCUIT

This application claims priority from European Patent Application No. 13193326.9 filed 18 Nov. 2013, the entire disclosure of which is incorporated herein by reference.

TECHNICAL FIELD

The present invention relates to the field of envelope detector circuits and in particular, but not exclusively, to low-power circuits for detecting envelope waveforms in amplitude-modulated signals.

BACKGROUND OF THE INVENTION

Envelope detectors are commonly used for demodulating low-frequency information content from higher-frequency carrier signals. An example of such an application is in RFID chips, for example, where circuitry is required to extract amplitude modulation envelope information from received radio-frequency signals.

In RFID chips, envelope detectors can be used to convert the amplitude modulated signal sent by a tag reader into a so-called baseband signal which contains the modulation signal, without the radio frequency carrier signal present in the reader signal. Such a signal can then be exploited by the logic portion of the RFID chip.

Full-wave envelope detector circuits have been used in RFID chips, but typically suffer from disadvantages including poor sensitivity (ie they are unable to operate with low signal amplitudes), variations in manufacturing process, instability due to temperature drift and/or a variation in the output signal when the RF power of the input signal varies.

It has been suggested in patent document U.S. Pat. No. 4,000,472 to address some of these problems, and in particular the problems of poor sensitivity and temperature drift. In the circuit proposed in U.S. Pat. No. 4,000,472, a voltage doubler circuit, forming an amplitude modulation envelope detector, is forward biased using a forward biasing circuit. This biasing circuit comprises a current source formed by a resistor, which provides a bias current in order to increase the linear dynamic range of the voltage doubler. The temperature drift is compensated by means of a temperature compensation circuit associated to an analog-to-digital converter formed by an operational amplifier. This compensation circuit also receives the bias current. The voltage doubler circuit has two diodes whose electrical characteristics vary with varying temperature, and the temperature compensation circuit has two further diodes, matched to the two diodes of the voltage doubler circuit, which provide a compensation reference to the inverting input of the operational amplifier. The circuit proposed in U.S. Pat. No. 4,000,472 is relatively complex and makes use of resistive elements and an operational amplifier. As such, the solution does not lend itself to miniaturized or very low power applications such as RFID tags. Resistive components require significant silicon real-estate and may increase power dissipation, and the inclusion of an amplifier circuit also increases size, complexity and power consumption. Further, the temperature compensation is not done at the level of the envelope detector, but at a higher level involving an operational amplifier.

Another disadvantage with some prior art envelope detectors is that there is a DC voltage on their output even when no input signal is present, and this DC voltage must preferably be compensated for.

SUMMARY OF THE INVENTION

It is an aim of the present invention to overcome at least some of the above disadvantages of prior art envelope detector circuits. In particular, the invention aims to provide an envelope detector circuit which is highly sensitive, which is independent of variations in temperature or variations in its fabrication process, which may be made smaller or simpler in construction, and/or which has a lower power consumption. To this end, the invention foresees an envelope detector circuit, for detecting an envelope waveform in an input signal applied to an input of the envelope detector circuit, which comprises an input capacitor connected between said input and a first circuit node of a first circuit branch, this first circuit branch being connected between a first power source and a second power source, wherein the first circuit branch comprises:

a first rectifying element connected between the first power source and the first circuit node, so as to permit a first current flow only in a first direction through the first circuit branch; and a second rectifying element connected between the first circuit node and a second circuit node, so as to permit a second current flow also only in said first direction through the first circuit branch.

An output capacitor is connected between the second circuit node and the second power source.

This envelope detector circuit is further characterized in that the first rectifying element is formed by a first transistor, and in that the envelope detector circuit further comprises a biasing voltage generating circuit for generating a biasing voltage which is provided to a control gate of the first transistor, the biasing voltage generating circuit being arranged so as to permit a determined forward biasing current to flow through the first and second rectifying elements when no input signal is applied to said input of the envelope detector circuit.

According to a preferred variant, the first transistor and the biasing voltage are selected such that, at least when no input signal is applied to said input, the first transistor operates in weak inversion mode.

According to a preferred embodiment of the envelope detector circuit of the invention, the biasing voltage generating circuit comprises in series a first current source and a second circuit branch connected between the first power source and the second power source, and the second circuit branch comprises in series a second transistor, matched to the first transistor, and a matching element matched to the second rectifying element. The biasing voltage is also provided to the control gate of the second transistor.

Variants of the inventive envelope detector circuit are described in the following description of the invention.

BRIEF DESCRIPTION OF THE DRAWINGS

The invention will now be described in more detail with reference to the accompanying drawings, in which.

It should be noted that the drawings are provided as an aid to understand certain principles underlying the invention, and should not be taken as implying any limitation in the scope of protection sought. Where the same reference signs have been used in more than one figure, these are intended to refer to the same or corresponding features.

DETAILED DESCRIPTION OF EMBODIMENTS OF THE INVENTION

Figure 1:
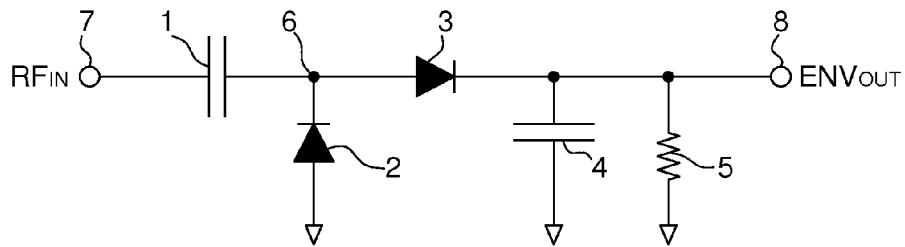
FIG. 1 shows an envelope detector having a voltage doubler, as known in the prior art.

FIG. 1 shows an envelope detector circuit using a voltage doubler circuit, as known in the prior art. This envelope detector circuit comprises an input capacitor 1, connected in series with the input 7, to which can be applied an input signal $RF_{IN}$. A pair of diodes 2 and 3 is arranged as a full-wave rectifier with respect to node 6 which is connected to input capacitor 1, and a second capacitor 4 is connected in parallel across the circuit output. The series capacitor 1 and the diode 2 together form a clamping circuit which builds a DC voltage across the series capacitor 1. If the diodes are taken as being ideal, then the DC voltage at output 8 will theoretically become equal to the peak-to-peak amplitude of the RF input voltage once capacitors 1 and 4 are charged. A resistor 5 provides a discharge path for capacitor 4, thereby ensuring that this capacitor does not remain fully charged, and that the envelope signal is presented at the output $ENV_{OUT}$.

$RF_{IN}$ may for example be a signal received from an RFID tag reader, and may typically comprise a radio-frequency carrier signal (for example having a frequency of several hundred kHz to several tens of MHz), modulated in amplitude by a baseband signal which conveys the data to be sent to the RFID tag. The $RF_{IN}$ signal is typically an alternating voltage, while the logic circuitry of the RFID tag typically requires a positive waveform signal.

The use of a full-wave rectification circuit thus has the effect that the desired envelope signal can be extracted from the full available RF signal amplitude (in contrast to envelope detector circuits using a half-wave rectifier arrangement). The series capacitor 1 also provides a DC isolation between the RF input and the node 6. This DC isolation permits the diodes 2 and 3 to be biased, for example by supplying a small DC current through them (a resistor is provided for this purpose in the circuit of U.S. Pat. No. 4,000,472), thereby bringing them to a state close to significant current conduction. This is similar to using diodes with very low thresholds, and has the effect that modulation information can be extracted from very low-amplitude RF input signals.

Figure 2:
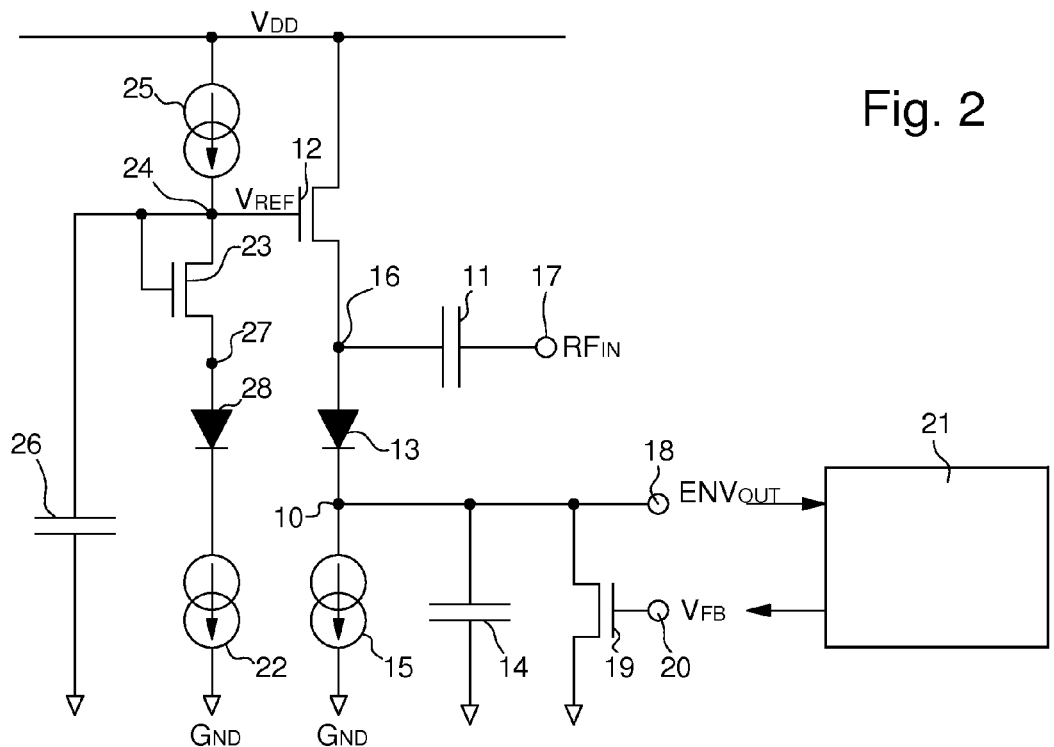
FIG. 2 shows an example of an envelope detector circuit according to the present invention.

FIG. 2 shows an embodiment of an envelope detector circuit according to the present invention. In this example, the components of the right-hand branch of the circuit, namely, transistor 12, diode 13 and current source 15, together with input capacitor 11 and output capacitor 14, are configured as an envelope detector circuit. The functions of capacitor 11, transistor 12, diode 13 and capacitor 14 of FIG. 2 essentially correspond in function to those of capacitor 1, diode 2, diode 3 and capacitor 4 respectively in FIG. 1. However, the use of transistor 12 instead of a classical diode is an essential feature of the invention. It is to be noted that transistor 12 is not simply mounted as a diode with its control gate connected to its drain, but its control gate is controlled by a specific biasing circuit. According to the present invention, transistor 12 is configured to provide a rectification function and a current control function in the right-hand branch of the circuit, as will be discussed below.

Note that the term "rectifying element" is used in this application as a general term to refer to an electronic component such as a diode or a transistor, or any electronic device which can be used to provide the function of a rectifying diode and/or the function of a switching or amplifying transistor, as required. For example, rectifying elements 13 and 28 are shown in FIG. 2 as diodes, but in practice may be implemented as diode-mounted transistors. The terms "diode", "diode element" and "rectifying element" are used in this application to refer to any electronic unit or element which is capable of providing the function of a conventional semiconductor diode. In particular, the term includes the use of a transistor configured as a diode.

The term "matched" is used in this application to refer to circuit elements whose electrical characteristics are substantially identical. This may be achieved, for example, by using components having substantially the same geometry and materials. Transistors 12 and 23 in FIG. 2 are matched, for example, as are the diodes (or diode-connected transistors) 13 and 28. In a CMOS process, the matching is generally achieved by fabricating the matched transistors/diodes using the same mask dimensions, the same process and the same substrate and doping conditions.

The terms "current source" and "current sink" are used in this application in their conventional sense, to refer to a circuit element which delivers or absorbs a current which is, in a saturation domain, substantially independent of the voltage across it.

The transistors referred to in this application are generally understood to be MOSFET transistors, fabricated on a common substrate (usually silicon). However, the term also includes other types of transistor which could be used to achieve the same or equivalent electrical function.

Transistor 12 functions as a diode, permitting current flow in only one direction, and the current flow through this transistor 12 is controllable in dependence on the voltage $V_{REF}$ applied on its control gate. Current sink element 15 provides a discharge path for output capacitor 14, thereby permitting the modulation of the input signal $RF_{IN}$ to be detected at output 18. In this respect, the purpose of current sink element 15 thus corresponds approximately to that of the resistor 5 in FIG. 1, but the selection of a current source permits a decrease of the power consumption.

When the envelope detector is in operation, transistor 12 is forward biased by the voltage $V_{REF}$ on its control gate, such that it permits a small determined current to flow through the right-hand branch of the circuit. This current in turn forward biases the diode 13 when no input voltage is applied to circuit node 16 from the input 17. Thus, by judicious choice of $V_{REF}$, both the transistor 12 and the diode 13 can be maintained in a state of high sensitivity, in which a small change in the voltage at circuit node 16 can produce a large change in current flowing through the right-hand circuit branch.

With the circuit in this sensitive detection state, even a small positive voltage at circuit node 16 as a result of a change in $RF_{IN}$ results in diode 13 quickly turning on, and a rapid transfer of charge from input capacitor 11 to output capacitor 14. Subsequently, when $RF_{IN}$ changes such that the voltage at circuit node 16 goes negative, the charge lost from capacitor 11 through diode 13 is rapidly replenished through transistor 12. This rapid charge replenishment occurs when the voltage at node 16 becomes lower than $V_{REF}-V_{TH}$, where $V_{REF}$ is the voltage at circuit node 24 and $V_{TH}$ is the threshold of transistor 12 (and also of matched transistor 23), and the transconductance of transistor 12 quickly increases.

Because of its high sensitivity, this envelope detector arrangement is highly dependent on temperature and fabrication process variations. By closely controlling $V_{REF}$, however, it is possible to compensate for such temperature and fabrication process variations. To this end, a matched biasing voltage generating circuit is provided for generating and controlling the reference voltage $V_{REF}$. This is shown as the left-hand branch of the circuit in FIG. 2 (ie components 25, 23, 28 and 22). Components 23, 28 and 22 are respectively matched to the corresponding components of the right-hand (envelope detector) branch, ie components 12, 13 and 15. Hence transistor 12 is matched to transistor 23, diode 13 is matched to diode 28 and current sink 15 is matched to current sink 22. It is to be noted that current sinks 15 and 22 are selected so that each has a current sinking capability which permits the sinking of a current higher than the one provided by the current source 25.

The purpose of the matched transistor 23 is to compensate for the gate to source voltage drop of transistor 12 which is required for the biasing current to flow through the latter. Transistor 23 is diode-mounted and therefore is in saturation. Its gate to source voltage $V_{GS}$ is such that it conducts the current which is provided by current source 25. When there is no signal $RF_{IN}$ on input 17, transistor 12 is also in saturation and has the same gate-to-source voltage as transistor 23, because components 28 and 22 are respectively matched copies of components 13 and 15. Then, because transistor 12 is a matched copy of transistor 23, the bias current flowing through transistor 12 is the same as the current supplied by current source 25 which flows through transistor 23. Thank to the invention, by adjusting the magnitude of the current supplied by the current source 25, it is possible to control the bias current flowing in the right-hand circuit branch and thus the bias current This biasing arrangement has the effect that, as soon as the voltage at circuit node 16 becomes slightly larger than the voltage at circuit node 27 (as a result of a change in the input signal $RF_{IN}$), a significant current starts flowing through diode 13. Similarly, a significant current starts flowing through transistor 12 as soon as the voltage at circuit node 16 becomes slightly less than the voltage at circuit node 27 as a result of a change in $RF_{IN}$. This is the behavior needed to be able to detect small input signals.

Capacitor 26 may advantageously be included to filter out any RF signals which penetrate from the RF input 17 through the input capacitor 11 and the source-to-gate coupling of transistor 12, thereby stabilizing the reference voltage $V_{REF}$ generated by the left-hand branch of the circuit in FIG. 2.

If the amplitude of the input signal $RF_{IN}$ increases to the point where it becomes comparable to the supply voltage $V_{DD}$, the performance of the detector circuit could be degraded. In an RFID tag, this would have the effect that, when the input signal $RF_{IN}$ is very large (eg when the tag is close to a tag reader), the RFID tag may no longer be able to detect and decode the reader messages. For example, if circuit node 16 is driven higher than $V_{DD}$, then parasitic PN junctions in the circuit may be turned on, with undesirable consequences.

One reason for this is that the discharge current through current source 15 is constant, and consequently the time needed to discharge signal $ENV_{OUT}$ during modulation is directly proportional to the amplitude of $ENV_{OUT}$. For large values of $ENV_{OUT}$ and fast modulations (ie steep envelope waveform gradients), the discharge current could be too small to discharge $ENV_{OUT}$ fast enough for correct envelope detection.

A more serious problem may arise if, for example, the output signal $ENV_{OUT}$ at circuit output 18 is connected to the input of a PMOS differential pair. In this case, if the amplitude of $ENV_{OUT}$ becomes too large, the differential pair will be forced out of its functional input voltage range.

In order to reduce such problems associated with a large-amplitude $RF_{IN}$ input signal, transistor 19 can be included as shown, in order to limit the voltage at circuit node 16 and at the output 18. Transistor 19 effectively functions as a current sink, controlled by a slowly varying feedback signal VFB applied to control input 20. VFB can be made proportional to the amplitude of $ENV_{OUT}$, for example by means of a feedback control circuit 21. When VFB becomes larger than the threshold voltage of transistor 19, the latter starts sinking current, thus preventing output signal $ENV_{OUT}$ from increasing any further.

As described above, the gate voltages on the matched transistors 12 and 23, and therefore the biasing currents supplied by transistors 12 and 23 to diodes 13 and 28 respectively, are substantially identical. Transistor 12 is shown as an n-channel, enhancement mode MOSFET, and the value of $V_{REF}$ is preferably selected such that the transistor 12 operates in weak inversion mode when no signal is present on the input 17. In this way, the maximum differential transconductance in the transistor, and therefore the maximum sensitivity to the input signal, is achieved.

The high sensitivity of the envelope detector circuit branch means that it can deliver charge to capacitor 11 as soon as $RF_{IN}$ goes negative, and provide the required biasing current to diode 13 as soon as $RF_{IN}$ goes positive. Thus, both the transistor 12 and the diode 13 function as devices with very low thresholds, and are therefore capable of detecting envelope waveform information even when the input signal $RF_{IN}$ has a very low amplitude.

However, by operating in weak inversion mode, the behavior of the transistor 12 is also greatly dependent on process variations and temperature variations. As will be discussed, the dependence on process variations can be compensated for by means of the matched left-hand circuit branch 22, 23, 28, while temperature variations can be compensated for by varying the current delivered by current source 25 in dependence on temperature.

By selecting a current source 25 having increasing current with increasing temperature (preferably as a substantially linear function), then the transconductance of transistor 12 and diode connected transistor 13 can be kept constant, thereby reducing the temperature-dependent characteristics of the envelope detector circuit.

The characteristics of the envelope detector branch, on the right-hand side, depend essentially on the bias current flowing through transistor 12 and diode 13. The reason for this is that the rectifying performance of these components depends on their differential conductance, which in turn depends on the bias current. Here, we assume that transistor 12 is in weak inversion, meaning that it exhibits an exponential $I_{DS}/V_{GS}$ relationship. The following analysis refers to the situation for diode 13, but a similar reasoning also applies to transistor 12. The current I flowing through diode 13 depends on the voltage V across it in the following way: $I=K_1 \cdot \exp(V/K_2)$, where $K_1$ is a constant which depends on the properties of diode 13, and $K_2$ is a constant which depends only on the temperature.

The differential conductance g of diode 13 is given by:

$$g=dI/dV=K_1/K_2 \cdot \exp(V/K_2)=I/K_2$$

Thus, the differential conductance g of diode 13 is linearly dependent on the current I flowing through the diode 13. Furthermore, this parameter is thus independent of the properties (size, doping . . . ) of diode 13 and is insensitive to process variations. If the current I is controlled, then the differential conductance g (and therefore the rectifying performance) of the diode 13 can similarly be controlled. Such a tight control of the current is provided by the left-hand circuit branch of FIG. 2 which generates a reference voltage Vref. Thanks to the properties of matching, the current which flows in the right-hand branch, when no input voltage 17 is present, must be equal to the current provided by current source 25.

As mentioned above, $K_2$ is temperature-dependent. Thus, the transconductance of the diode 13 increases linearly with decreasing temperature. Using known techniques, the current source 25 is preferably configured such that the current it delivers is proportional to temperature (ie the temperature of the device), thereby compensating for temperature-dependent variations of the transconductance of the diode 13.

An additional advantage of the envelope detector circuit of the invention is that the envelope voltage $ENV_{OUT}$ is at ground level when there is no input signal. This is again due to the properties of matching. Thus, there is no need to compensation for a DC offset in the output voltage.

What is claimed is:

1. An envelope detector circuit for detecting an envelope waveform in an input signal applied to an input of the envelope detector circuit, the envelope detector circuit comprising:
an input capacitor connected between the input and a first circuit node of a first circuit branch, the first circuit branch being connected between a first power source and a second power source, wherein the first circuit branch comprises
a first rectifying element connected between the first power source and the first circuit node, wherein the first rectifying element is operably connected so as to permit a first current flow only in a first direction through the first circuit branch; and
a second rectifying element connected between the first circuit node and a second circuit node, wherein the second rectifying element is operably connected so as to permit a second current flow also only in the first direction through the first circuit branch;
an output capacitor being connected between the second circuit node and the second power source,
wherein the first rectifying element comprises a first transistor, wherein the envelope detector circuit further comprises a biasing voltage generating circuit for generating a biasing voltage,
wherein the biasing voltage is provided to a control gate of the first transistor, the biasing voltage generating circuit being arranged so as to permit a determined forward biasing current to flow through the first and second rectifying elements when no input signal is applied to the input,
wherein the first transistor and the biasing voltage being selected such that, at least when no input signal is applied to the input, the first transistor operates in weak inversion mode, and
wherein the biasing voltage generating circuit comprises, in series, a first current source and a second circuit branch connected between the first power source and the second power source, the second circuit branch comprising, in series, a second transistor, matched to the first transistor, and a matching element matched to the second rectifying element.

2. An envelope detector circuit according to claim 1, wherein said biasing voltage is also provided to the control gate of the second transistor.

3. An envelope detector circuit according to claim 2, wherein the second transistor is connected as a diode, a third circuit node between the first current source and the drain of the second transistor being connected to the control gate of the first transistor.

4. An envelope detector circuit according to claim 1, wherein the second rectifying element is formed by a third transistor connected as a diode.

5. An envelope detector circuit according to claim 1, wherein the first circuit branch comprises a second current source connected between the second circuit node and the second power source, the second current source being connected in parallel with said output capacitor; wherein the second circuit branch comprises a third current source connected between said matching element and the second power source.

6. An envelope detector circuit according to claim 3, wherein the first circuit branch comprises a second current source connected between the second circuit node and the second power source, the second current source being connected in parallel with said output capacitor; wherein the second circuit branch comprises a third current source connected between said matching element and the second power source.

7. An envelope detector circuit according to claim 1, wherein the first current source is configured to provide a current which is substantially proportional to the temperature of the envelope detector circuit.

8. An envelope detector circuit according to claim 1, wherein a discharge element is arranged in parallel to the output capacitor so as to provide a further discharge path for the output capacitor.

9. An envelope detector circuit according to claim 8, wherein the discharge current flowing through the discharge element is controllable in dependence on a feedback signal, the envelope detector being associated to a RF power detector circuit configured to receive an envelope signal from the second circuit node and to generate the feedback signal as a function of the envelope signal.

10. An envelope detector circuit according to claim 9, wherein the discharge element is formed by a fourth transistor; and wherein the feedback signal is applied to a gate of the fourth transistor such that the discharge current is permitted to flow through the fourth transistor when the magnitude of the feedback signal exceeds the threshold voltage of the fourth transistor.

11. An RFID tag comprising an envelope detector circuit according to claim 1.

12. An RFID tag comprising an envelope detector circuit according to claim 2.

13. An RFID tag comprising an envelope detector circuit according to claim 3.

* * * * *